United States Patent [19]

Yamauchi

[11] Patent Number: 5,243,561

[45] Date of Patent: Sep. 7, 1993

[54] DATA ERASING AND RE-WRITING CIRCUIT FOR USE IN MICROCOMPUTER INTEGRATED CIRCUIT DEVICE

[75] Inventor: Naoki Yamauchi, Hyogo, Japan

[73] Assignee: Mitsubishi Denki Kabushiki Kaisha, Tokyo, Japan

[21] Appl. No.: 749,434

[22] Filed: Aug. 26, 1991

[30] Foreign Application Priority Data

Sep. 4, 1990 [JP] Japan ................................ 2-234671

[51] Int. Cl.$^5$ ................................................ G11C 7/00
[52] U.S. Cl. ................................ 365/189.12; 365/218; 365/233; 365/236
[58] Field of Search .................... 365/218, 189.12, 220, 365/221, 239, 219, 233, 236

[56] References Cited

U.S. PATENT DOCUMENTS

| | | | |
|---|---|---|---|
| 4,321,695 | 3/1982 | Redwine et al. | 365/200 X |
| 4,506,348 | 3/1985 | Miller et al. | 365/189.12 |
| 4,866,616 | 9/1989 | Takeuchi et al. | |
| 4,987,559 | 2/1991 | Miyauchi et al. | 365/189.12 |

FOREIGN PATENT DOCUMENTS

0370529A2 5/1990 European Pat. Off. .
87/05420 9/1987 World Int. Prop. O. .

OTHER PUBLICATIONS

"Z80 Microprocessor Technology, Hardware, Software and Interfacing", 1986, Bignell et al., pp. 203-219.

Primary Examiner—Eugene R. LaRoche
Assistant Examiner—Son Dinh
Attorney, Agent, or Firm—Lowe, Price, LeBlanc & Becker

[57] ABSTRACT

Data in an EEPROM contained in a microcomputer integrated circuit device is erased and re-writing. Upon a detection of a start bit of the data, data of a plurality of bits is accepted in a shift register in response to a clock signal applied from a synchronization circuit. A counter counts clock signals up to the number corresponding to the data of a plurality of bits to inhibit data writing in the shift register. The data accepted in the shift register is temporarily stored as bit parallel data of a plurality of bits in a receiving buffer and selected by a selector to be applied to the EEPROM. The data is written, by a write control circuit, at an address in the EEPROM designated by an address counter.

6 Claims, 4 Drawing Sheets

DATA ERASING AND RE-WRITING CIRCUIT FOR USE IN MICROCOMPUTER INTEGRATED CIRCUIT DEVICE

BACKGROUND OF THE INVENTION

1. Field of the Invention

The present invention relates generally to data erasing and re-writing circuits for use in a microcomputer integrated circuit device. More particularly, the present invention relates to a data erasing and re-writing circuit for use in a microcomputer integrated circuit device which circuit erases and re-writes a program of a memory contained in an integrated circuit referred to as a one-chip microcomputer.

2. Description of the Background Art

In resent years, there is a demand for a microcomputer with a programmable, and erasable and programmable EPROM connected thereto and such microcomputer has come into practical use.

FIG. 6 is a schematic block diagram showing a conventional microcomputer integrated circuit containing an EPROM without a representation irrelevant to the present invention. A CPU1 is connected through a bus 5 to an erasable and programmable read only memory (referred to as an EPROM hereinafter) 2 and an input/output port 3, both of which receive external input/output signals. A write control circuit 4 is provided for writing the data of the input/output signals to the EPROM 2. The circuit 4 receives external write control signals.

Operation of the one-chip microcomputer shown in FIG. 6 will be described. The CPU1 executes a program written in the EPROM 2 and refers to the data written in the EPROM if necessary. The external input/output signals are received and sent through the input/output port 3. In response to an external write control signal, the write control circuit 4 writes data in the EPROM according to address signals included in the input/output signals. The EPROM 2 is programmed by using a generally-called EPROM programmer device before mounting the one-chip microcomputer device on a printed circuit board.

Thus arranged conventional microcomputer requires a control program to be written in an EPROM by another device before packaging on a printed circuit board. For rewriting a once written program, the storage contents of the EPROM 2 with a transparent window should be erased through ultra-violet light irradiation and the EPROM 2 should be re-programmed before packaging thereof. In particular, a surface mounting type package referred to as a multi-terminal flat pack type package causes damage to lead lines in an integrated circuit or a pattern on a printed circuit board when in taking off the package from the printed circuit board or re-mounting the same, thereby making it difficult to re-writing program in the practice.

In addition, at the time of programming the EPROM when the computer device is mounted on a printed circuit board on which input/output port 3 is OR-connected to external circuits through wires, the external circuits might be short-circuited to produce excessive load.

SUMMARY OF THE INVENTION

Therefore, an object of the present invention is to provide data erasing and writing circuit for use in a microcomputer integrated circuit device capable of changing a program stored in a memory with ease while the device is mounted on a printed circuit board.

Briefly stated, the present invention is a data erasing and writing circuit for use in a microcomputer integrated circuit device including a central processing unit, wherein external bit serial data is applied to a read only memory by a serial data transmission circuit and the data is written in the read only memory by a write circuit.

Therefore, the present invention enables direct writing of new program data and the like to a microcomputer integrated circuit device mounted on a printed circuit board without affecting an external circuit connected to input/output terminals of the device. It is in particular possible to drastically reduce time required for taking off and re-mounting the device on a surface of a printed circuit board, which device is mounted in a surface mounting type packaging manner using multiple terminals. Furthermore, data to be re-written is applied in a serial-by-bit manner to reduce the number of input terminals.

According to a preferred embodiment of the present invention, bit serial data includes a start bit indicative of a start of the data, data of a plurality of bits and a stop bit indicative of the end of the data. The data of a plurality of bits is converted into bit parallel data and applied to a read only memory in response to a detection of the start bit.

According to a further preferred embodiment of the present invention, a gate circuit is opened to apply data of a plurality of bits to a shift register in response to a detection of the start bit and the data is converted into bit parallel data which is applied to a read only memory. Data writing to the shift register is carried out in response to a clock signal from a synchronization circuit. The clock signal is counted by a counter and the gate of the gate circuit is closed in response to the counting of the clock signals up to the number corresponding to the data of a plurality of bits.

According to a further preferred embodiment of the present invention, a counter counts clocks up to the number corresponding to data of a plurality of bits to detect an error in response to no detection of a stop bit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
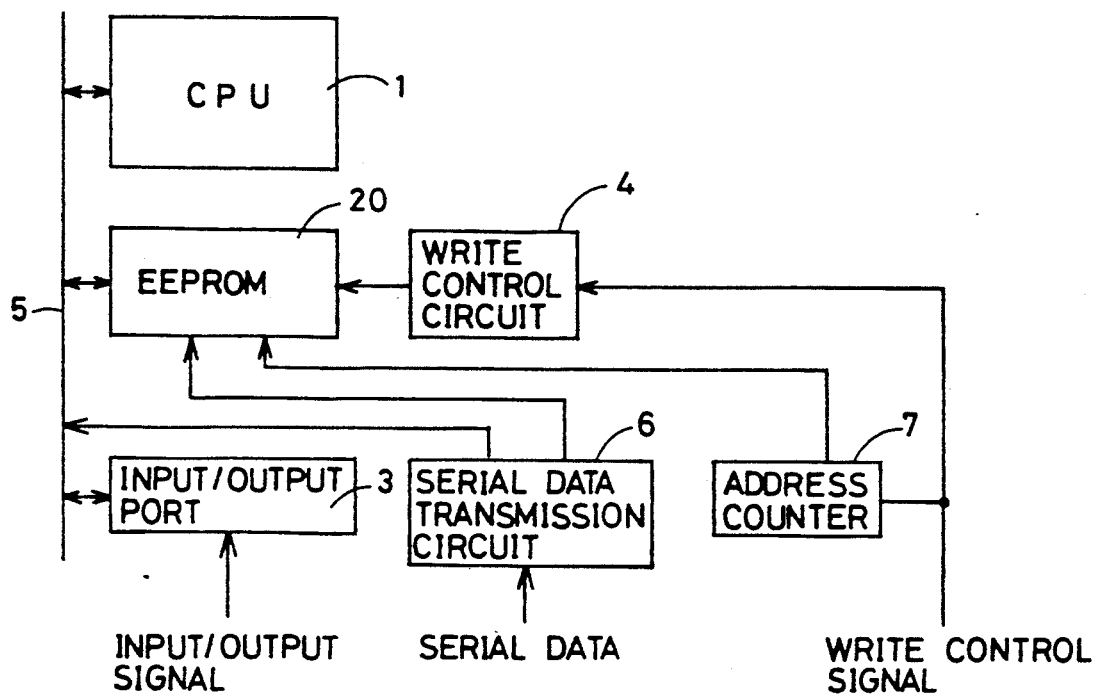
FIG. 1 is a schematic block diagram showing one embodiment of the present invention.
Figure 6:
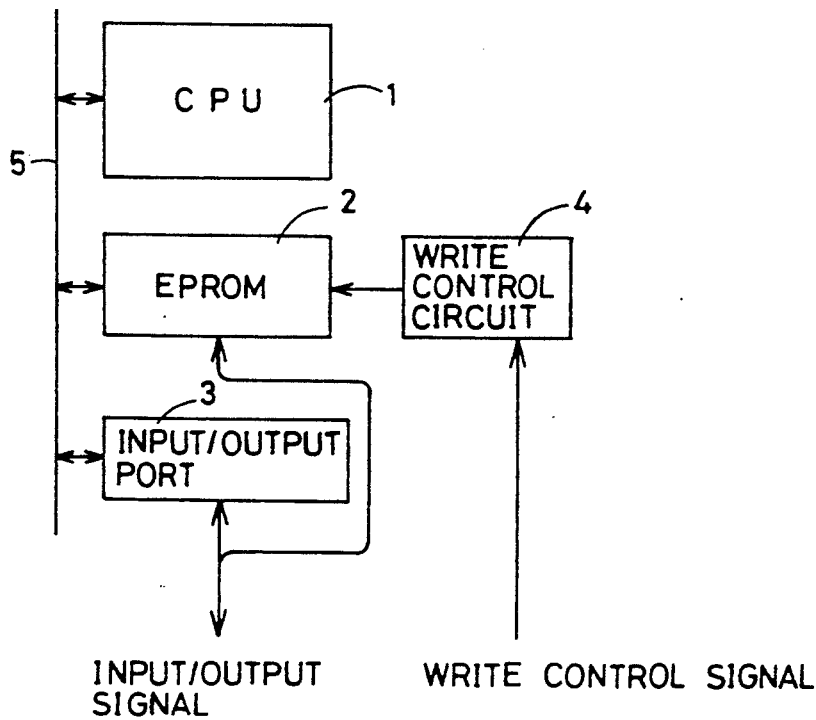
FIG. 6 is a schematic block diagram of a conventional microcomputer integrated circuit.

FIG. 1 is a schematic block diagram showing one embodiment of the present invention. With reference to FIG. 1, a CPU1 is connected to an electrically erasable and programmable read only memory (hereinafter referred to as EEPROM) 20 and an input/output port 3 through a bus 5 and a write control circuit 4 is connected to the EEPROM 20. Additionally provided in the CPU 1 are a serial data transmission circuit 6 and an address counter 7 which characterize the present invention. The serial data transmission circuit 6 receives external serial data and converts the same to bit parallel data which is applied to the EEPROM 20 wherein the data is written, by the write control circuit 4, at the address designated by the address counter 7.

Figure 2:
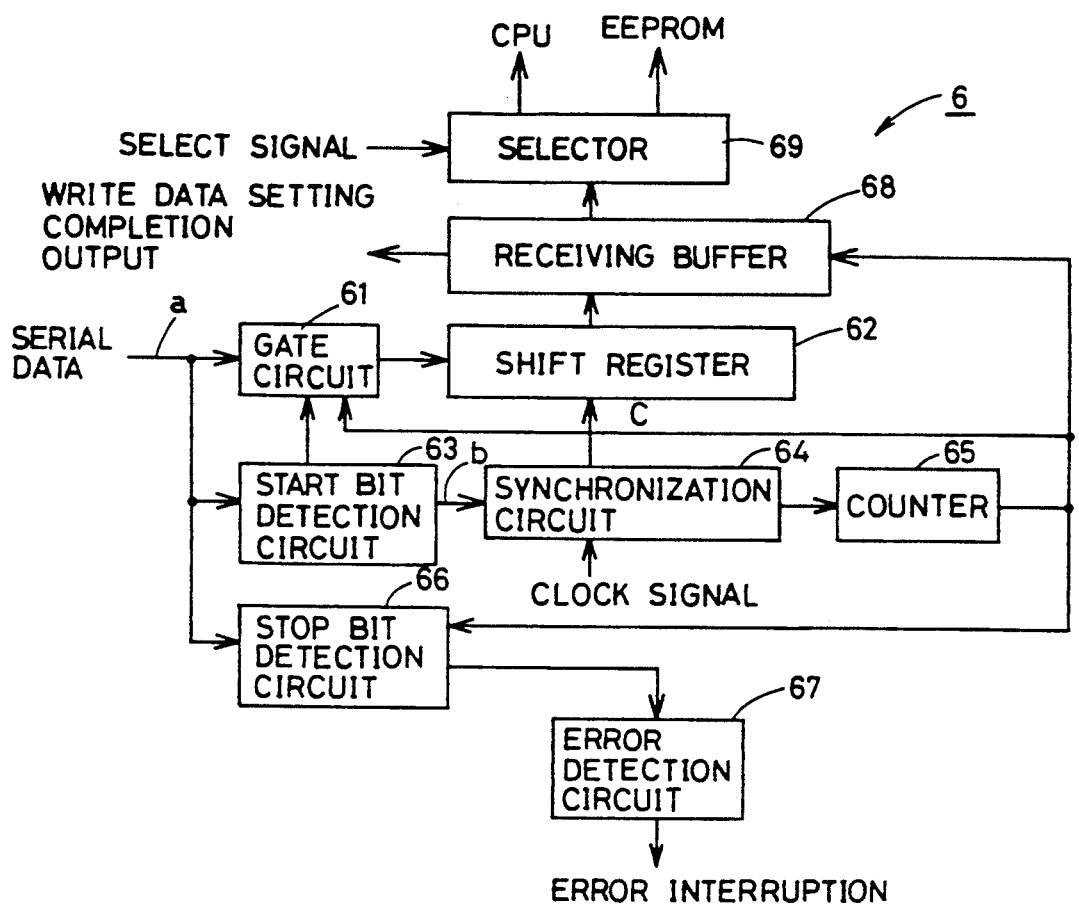
FIG. 2 is a specific block diagram of a serial data transmission circuit shown in FIG. 1.
Figure 3:
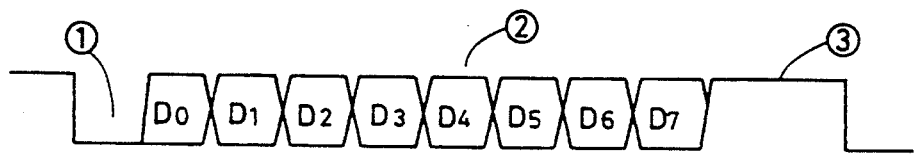
FIG. 3 is a diagram showing serial data to be applied to the serial data transmission circuit.

FIG. 2 is a specific block diagram of the serial data transmission circuit shown in FIG. 1 and FIG. 3 is a diagram showing serial data applied to the serial data transmission circuit.

An arrangement of the serial data transmission circuit 6 will be described with reference to FIG. 2. As shown in FIG. 3, the serial data includes a start bit ①, 8-bit data ② and a stop bit ③. The serial data is applied to a gate circuit 61, a start bit detection circuit 63 and a stop bit detection circuit 66. The start bit detection circuit 63 detects a change of the start bit ① included in the serial data from "1" to "0" and applies the detection output to the gate circuit 61 and a synchronization circuit 64 The gate circuit 61 extracts the 8-bit data ② to apply the same to a shift register 62 upon the reception of the detection output of the start bit ①. Upon the reception of the detection output of the start bit ①, the synchronization circuit 64 applies a data reading clock to the shift register 62. In response to the data reading clock, the shift register 62 accepts the 8-bit data ②.

A counter 65 counts data reading clocks up to 8 bits to apply the counting output to the gate circuit 61, the stop bit detection circuit 66 and a receiving buffer 68. The gate circuit 61 closes its gate in response to the counting output to prevent application of the serial data to the shift register 62. The stop bit detection circuit 66 detects the stop bit ③ being "1" when receiving the counting output from the counter 65. Detection of the serial data being "0" without the stop bit 3 at this time, is considered to be a framing error, so that an error detection circuit 67 generates an error signal to interrupt the CPU1 for an error processing.

The error detection circuit 67 may generate a parity error when parity bits does not agree with the parity bits generated from the received data and may detect an overrun error that before the CPU1 receives data transferred from the receiving buffer 68, the subsequent received data overflows to the shift register 62.

The receiving buffer 68 accepts the 8-bit data ② output from the shift register 62 in response to the counting output of the counter 65 and applies the same to a selector 69. After applying the data to the selector 69, the receiving buffer 68 applies a write data setting completion output to the CPU1. The selector 69 applies the data bit to the EEPROM 20 in response to a select signal applied from the CPU1.

Figure 4:
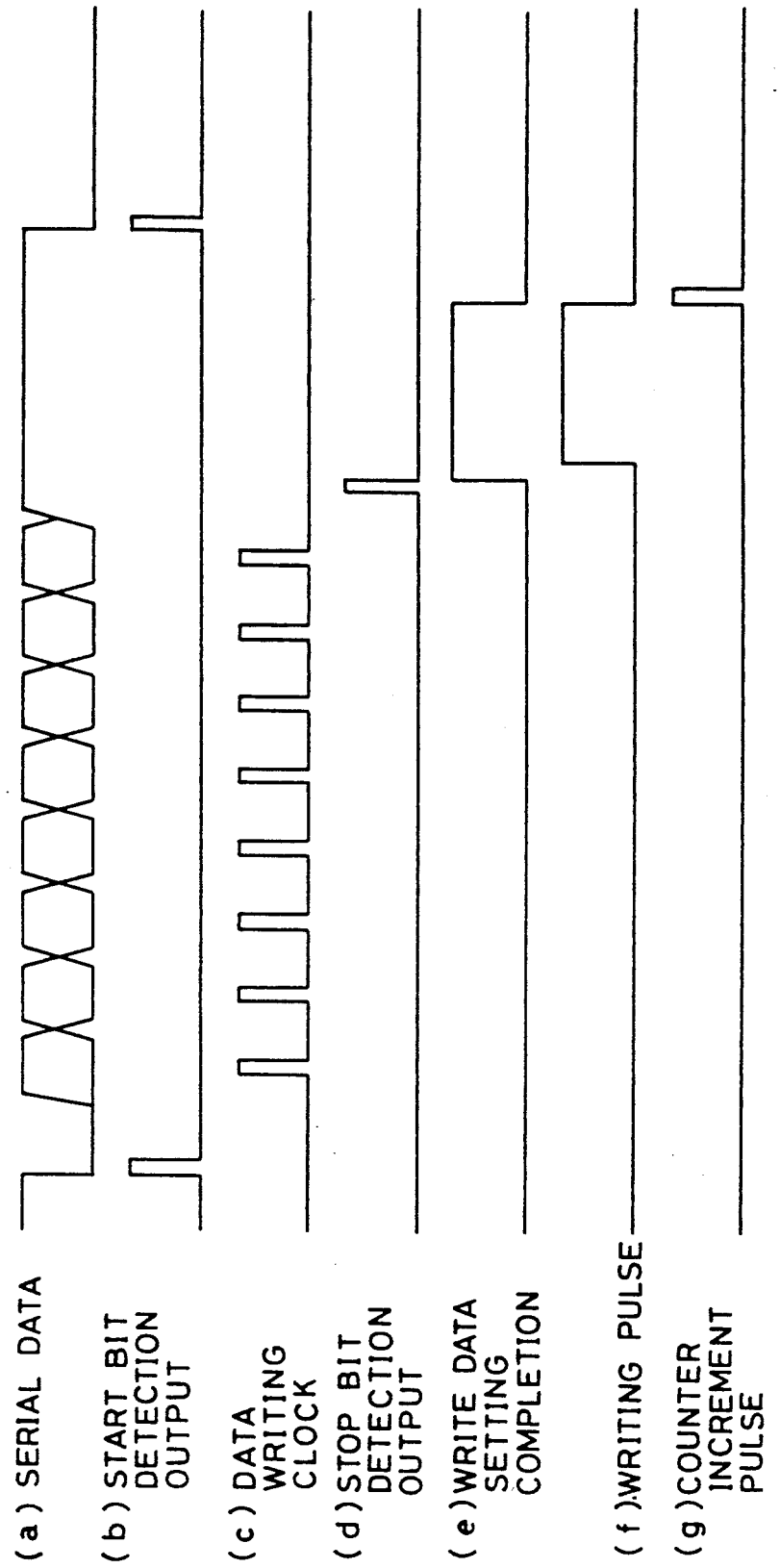
FIG. 4 is a timing chart explaining operation of one embodiment of the present invention.
Figure 5:
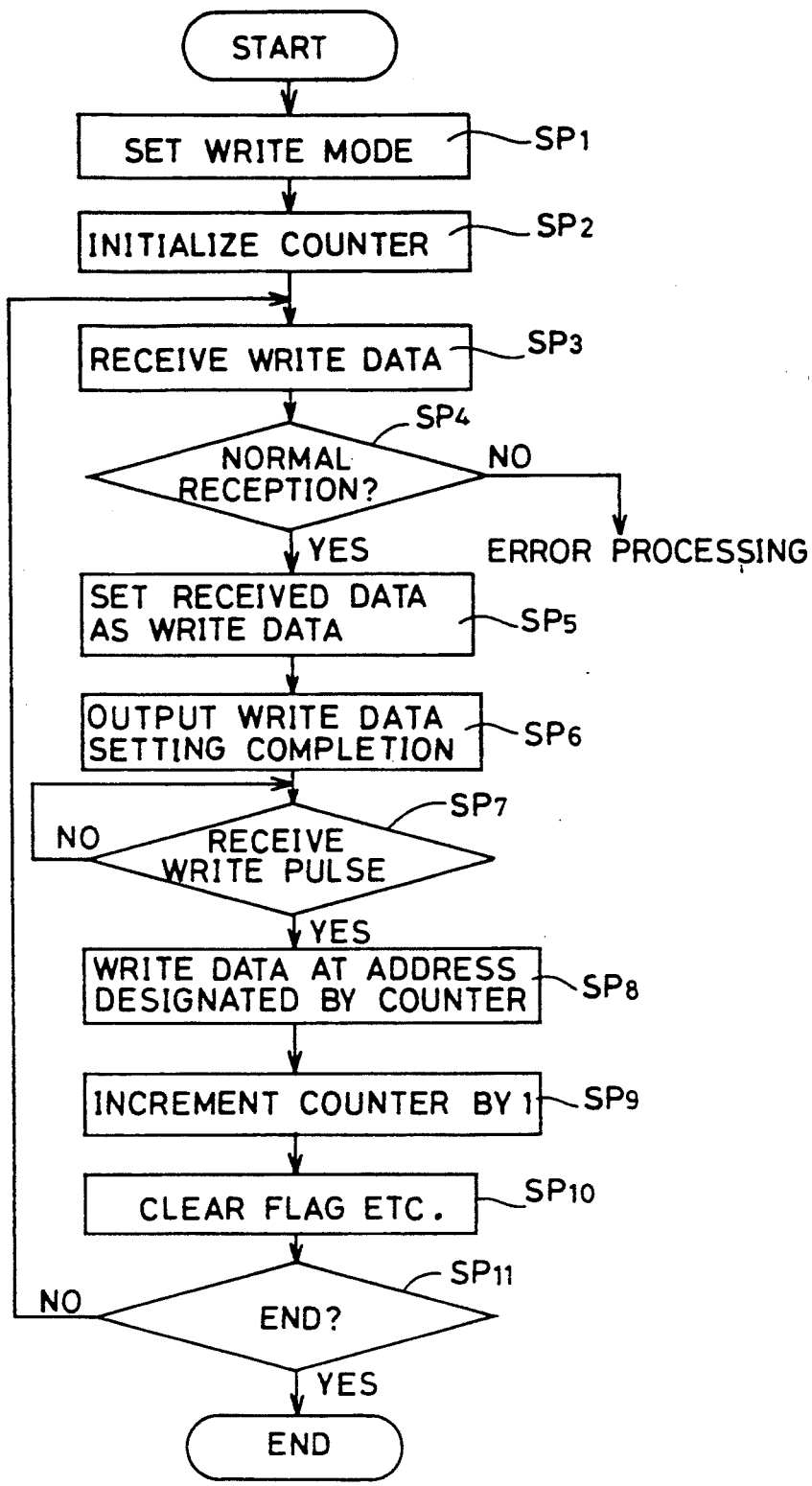
FIG. 5 is a flow chart.

FIG. 4 is a timing chart explaining operation of one embodiment of the present invention and FIG. 5 is a flow chart of the same.

A specific operation of one embodiment of the present invention will be described with reference to FIGS. 1 through 5. The CPU1 sets a write mode at step (referred to as SP in the drawings) SP1 and initializes the address counter 7 at step SP2. External serial data shown in FIG. 4(a) is applied to the serial data transmission circuit 6. The start bit detection circuit 63 in the serial data transmission circuit 6 detects the start bit ① of the serial data and applies the detection output shown in FIG. 4(b) to the gate circuit 61. In response thereto, the gate circuit 61 applies the 8-bit data ② to the shift register 62.

The synchronization circuit 64 applies the data reading clock shown in FIG. 4(c) to the shift register 62 in response to the detection output of the start bit detection circuit 63. The shift register 62 accepts the 8-bit data ② in response to the clock. The counter 65 counts data reading clocks of 8 bits to apply the counting output to the gate circuit 61, the stop bit detection circuit 66 and the receiving buffer 68. In response thereto, the gate circuit 61 closes the gate to prevent application of the serial data to the shift register 62. The receiving buffer 68 accepts the data bit ② from the shift register 62. The stop bit detection circuit 66 detects the stop bit ③ to output the detection output shown in FIG. 4(d). The error detection circuit 67 detects an error when no stop bit ③ is detected, thereby interrupting the CPU1 for error processing.

When determination is made at step SP4 that the stop bit is detected, the CPU1 sets the data accepted in the shift register 62 as write data at the receiving buffer 68 at step SP5. At this time, the receiving buffer 68 outputs the write data setting completing signal shown in FIG. 4(e) which is applied to the CPU1. The write control circuit 4 makes a determination as to whether an external write pulse is applied or not at step SP7. If no write pulse is applied, the circuit stands by for a pulse application. When the write control circuit 4 detects the write pulse application, the circuit writes the 8-bit data ② output from the receiving buffer 68 through the selector 69 at the address in the EEPROM 20 designated by the address counter 7.

While a write control signal is input for incrementing the address counter in the above-described embodiment, the address counter 7 can be incremented by a write data setting completing signal output from the receiving buffer 68 provided in the serial data transmission circuit 6.

In addition, the address counter 7 can replace a part of a group of counters referred to as a timer circuit (not shown) provided in the one-chip microcomputer.

As described above, the embodiment according to the present invention in which external bit serial data applied through a serial data transmission circuit is converted into bit parallel data which data is directly applied to a read only memory, enables external new program data and the like to be directly written in a memory provided in a microcomputer integrated circuit device mounted on a printed circuit board without affecting an external circuit connected to the other input/output terminals of the device. In particular, a time period can be reduced required for taking off a package from a printed circuit board or re-mounting the same by using multiple terminals. In addition, data to be re-written is applied in a serial-by-bit manner to reduce the number of input terminals.

Although the present invention has been described an illustrated in detail, it is clearly understood that the same is by way of illustration and example only and is not to be taken by way of limitation, the spirit and scope of the present invention being limited only by the terms of the appended claims.

What is claimed is:

1. A data erasing and re-writing circuit for use in a microcomputer integrated circuit device including a central processing means, comprising:

electrically erasable and programmable read only memory, serial data transmitting means for applying external bit serial data to said read only memory, and writing means for writing the data applied from said serial data transmitting means in said read only memory, wherein said bit serial data includes a start bit indicative of the start of the data, data of a plurality of bits and a stop bit indicative of the end of the data, and said serial data transmitting means includes serial-parallel converting means responsive to a detection of said start bit for converting said data of a plurality of bits into bit parallel data and applying the same to said read only memory.

2. The data erasing and re-writing circuit for use in a microcomputer integrated circuit device according to claim 1, wherein said serial-parallel converting means includes:

start bit detecting means for detecting said start bit, gate means responsive to the detection output of said start bit detecting means for outputting said data of a plurality of bits, and shift register means for converting the data of a plurality of bits applied from said gate means into bit parallel data.

3. The data erasing and re-writing circuit for use in a microcomputer integrated circuit device according to claim 2, further comprising synchronizing means responsive to the detection of the start bit by said start bit detecting means for applying a clock signal to said shift register means to write said data in said shift register means in a serial-by-bit manner.

4. The data erasing and re-writing circuit for use in a microcomputer integrated circuit device according to claim 3, further comprising counting means for counting the clock signals output from said synchronizing means to close the gate of said gate means in response to the counting of the clock signals up to the number corresponding to said data of a plurality of bits.

5. The data erasing and re-writing circuit for use in a microcomputer integrated circuit device according to claim 4, further comprising:

stop bit detecting means for detecting said stop bit, and error detecting means responsive to said counting means counting the clocks up to the number corresponding to said data of a plurality of bits and to said stop bit detecting means detecting no stop bit for detecting an error.

6. The data erasing and re-writing circuit for use in a microcomputer integrated circuit device according to claim 2, further comprising buffer means for storing the bit parallel data output from said shift register means and applying the same to said read only memory.

* * * * *